(12) United States Patent
Dutta et al.

(10) Patent No.: US 12,389,803 B2
(45) Date of Patent: Aug. 12, 2025

(54) MAGNETORESISTIVE RANDOM-ACCESS MEMORY (MRAM) WITH PRESERVED UNDERLYING DIELECTRIC LAYER

(71) Applicant: International Business Machines Corporation, Armonk, NY (US)

(72) Inventors: Ashim Dutta, Clifton Park, NY (US); Shyng-Tsong Chen, Rensselaer, NY (US); Terry A. Spooner, Mechanicville, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 17/534,485

(22) Filed: Nov. 24, 2021

(65) Prior Publication Data

US 2023/0165156 A1 May 25, 2023

(51) Int. Cl.
*G11C 11/00* (2006.01)
*G11C 11/16* (2006.01)
*H01L 21/768* (2006.01)
*H01L 23/522* (2006.01)
*H10B 61/00* (2023.01)
*H10N 50/01* (2023.01)
(Continued)

(52) U.S. Cl.
CPC ............ *H10N 50/01* (2023.02); *G11C 11/161* (2013.01); *H01L 21/76885* (2013.01); *H01L 23/5226* (2013.01); *H10B 61/00* (2023.02); *H10N 50/10* (2023.02); *H10N 50/80* (2023.02)

(58) Field of Classification Search
CPC ........ H10N 50/01; H10N 50/80; H10N 50/10; H10B 61/00; G11C 11/161; H01L 21/76885; H01L 23/5226

USPC ......................................................... 365/158
See application file for complete search history.

(56) References Cited

U.S. PATENT DOCUMENTS

| 7,608,549 B2 | 10/2009 | Van Nooten et al. |
| 8,975,089 B1 | 3/2015 | Jung et al. |

(Continued)

OTHER PUBLICATIONS

International Searching Authority, "Notification of Transmittal of the International Search Report and the Written Opinion of the International Searching Authority, or the Declaration", File Reference PF220956PCT, International application No. PCT/CN2022/132914, International Filing Date Nov. 18, 2022, Mailed on Feb. 10, 2023, 8 pages.

*Primary Examiner* — Viet Q Nguyen
(74) *Attorney, Agent, or Firm* — Edward J. Wixted, III (57) ABSTRACT

Embodiments of the invention include a method for fabricating a semiconductor device and the resulting structure. A substrate having an embedded memory area interconnect structure and an embedded non-memory area interconnect structure is provided, the memory area interconnect structure comprising metal interconnects formed in dielectric material. A dielectric cap layer is formed on exposed surfaces of the memory area and the non-memory area. A bottom metal contact is formed on a first metal interconnect of the memory area interconnect structure, the bottom metal contact in a trench in the dielectric cap layer. A memory element stack pillar is formed on the bottom metal contact. A dielectric layer is formed on exposed surfaces of the memory area and the non-memory area utilizing a nonconformal deposition process. The dielectric layer is removed from sidewalls of the memory element stack pillar.

20 Claims, 8 Drawing Sheets

(51) Int. Cl.
   *H10N 50/10*   (2023.01)
   *H10N 50/80*   (2023.01)

(56) References Cited

U.S. PATENT DOCUMENTS

| | | | |
|---|---|---|---|
| 8,981,502 B2 | 3/2015 | Chen et al. | |
| 9,166,155 B2 | 10/2015 | Deshpande | |
| 9,306,157 B2 | 4/2016 | Deshpande | |
| 9,564,582 B2 | 2/2017 | Pakala et al. | |
| 9,806,252 B2 | 10/2017 | Tan et al. | |
| 9,837,603 B1 | 12/2017 | Deshpande et al. | |
| 10,008,662 B2 | 6/2018 | You et al. | |
| 10,043,705 B2 * | 8/2018 | Chu | H10N 50/85 |
| 10,707,413 B1 * | 7/2020 | Dutta | H10N 50/01 |
| 10,811,599 B2 * | 10/2020 | Clevenger | H10B 61/00 |
| 10,930,839 B2 * | 2/2021 | Chu | H10B 61/00 |
| 11,069,854 B2 * | 7/2021 | Rizzolo | H10N 50/80 |
| 11,121,173 B2 * | 9/2021 | Dutta | H01L 21/2633 |
| 11,152,426 B2 * | 10/2021 | Hsiao | H10N 50/01 |
| 11,189,658 B2 * | 11/2021 | Wei | H01L 21/762 |
| 11,223,008 B2 * | 1/2022 | Rizzolo | H10N 50/85 |
| 11,502,242 B2 * | 11/2022 | Dutta | H10N 50/80 |
| 11,545,521 B2 * | 1/2023 | Chen | H01F 41/34 |
| 11,683,988 B2 * | 6/2023 | Peng | H10N 50/10 257/421 |
| 11,696,510 B2 * | 7/2023 | Wu | H01L 21/76802 257/421 |
| 11,848,645 B2 * | 12/2023 | Agarwal | H03B 5/20 |
| 2013/0082339 A1 | 4/2013 | Aggarwal | |
| 2015/0255507 A1 | 9/2015 | Pakala | |
| 2015/0380640 A1 | 12/2015 | Deshpande et al. | |
| 2016/0126454 A1 | 5/2016 | Mudivarthi et al. | |
| 2018/0019387 A1 | 1/2018 | Tan | |
| 2018/0240969 A1 | 8/2018 | Doczy et al. | |
| 2020/0219932 A1 | 7/2020 | Muthinti | |
| 2021/0091301 A1 | 3/2021 | Arnold | |
| 2021/0126051 A1 | 4/2021 | Dutta | |
| 2021/0134883 A1 | 5/2021 | Dutta | |
| 2021/0375986 A1 * | 12/2021 | Dutta | H10N 50/80 |
| 2021/0391530 A1 * | 12/2021 | Chen | H10N 50/80 |
| 2022/0052255 A1 * | 2/2022 | Yang | H10B 61/00 |
| 2022/0069199 A1 * | 3/2022 | Huang | H10N 50/80 |
| 2022/0069201 A1 * | 3/2022 | Yin | H01L 21/7684 |
| 2022/0102621 A1 * | 3/2022 | Wang | H10N 50/85 |
| 2022/0328759 A1 * | 10/2022 | Yang | H10N 50/01 |
| 2022/0359814 A1 * | 11/2022 | Standaert | H10N 50/10 |
| 2023/0060906 A1 * | 3/2023 | Xie | H10B 61/00 |
| 2023/0098122 A1 * | 3/2023 | Dutta | H10N 50/80 257/427 |
| 2023/0138005 A1 * | 5/2023 | Kao | H10B 61/22 257/421 |
| 2023/0146034 A1 * | 5/2023 | Rizzolo | H10B 63/10 257/5 |

* cited by examiner

MAGNETORESISTIVE RANDOM-ACCESS MEMORY (MRAM) WITH PRESERVED UNDERLYING DIELECTRIC LAYER

BACKGROUND

The present invention relates generally to the field of magnetoresistive random-access memory (MRAM) devices and fabrication, and more particularly to the fabrication of a MRAM device and resulting structure that has a preserved dielectric cap remaining in a logic area of the device.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The other plate's magnetization can be changed to match that of an external field to store memory.

A magnetic tunnel junction (MTJ) includes two layers of magnetic metal separated by an ultrathin layer of insulator. The insulating layer is so thin that electrons can tunnel through the barrier if a bias voltage is applied between the two metal electrodes. MTJs are used in MRAM.

Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections.

SUMMARY

Embodiments of the invention include a method for fabricating a semiconductor device and the resulting structure. The method can include providing a substrate having an embedded memory area interconnect structure and an embedded non-memory area interconnect structure, the memory area interconnect structure comprising metal interconnects formed in dielectric material. The method can also include forming a dielectric cap layer on exposed surfaces of the memory area and the non-memory area. The method can also include forming a bottom metal contact on a first metal interconnect of the memory area interconnect structure, the bottom metal contact in a trench in the dielectric cap layer. The method can also include forming a memory element stack pillar on the bottom metal contact. The method can also include forming a dielectric layer on exposed surfaces of the memory area and the non-memory area utilizing a non-conformal deposition process. The method can also include removing the dielectric layer from sidewalls of the memory element stack pillar.

DETAILED DESCRIPTION

Embodiments of the present invention recognize that, in embedded magnetoresistive random-access memory (MRAM) devices, significant gouging of the dielectric layer underneath the bottom electrode occurs during ion beam etching (IBE) of the magnetic tunnel junction (MTJ) stack. Such a process can remove bottom electrode contact dielectric or dielectric cap layers in the logic area of an MRAM device and expose metal lines of the below interconnect level of the device. For copper metal lines, this causes a significant concern for device and downstream processing due to copper contamination. Current approaches reduce dielectric gouging by reducing IBE over etch and clean up time. However, such approaches induce footing at the base of the MRAM pillar and leaves metal residue on the MTJ sidewall causing junction short.

Embodiments of the present invention disclose a structure and method of forming an MRAM device with minimal bottom electrode dielectric gouging. In such embodiments, a non-conformal deposition (e.g., physical vapor deposition (PVD)) of dielectric material (e.g., SiN, SiC, SiCNH, $SiO_x$) is done after an IBE main etch, where deposited material is thicker on horizontal surfaces than on, for example, vertical sidewalls of the MRAM pillar(s). In some embodiments, the deposited material is about ten times thicker on the horizontal surface than on the pillar sidewall. Subsequently, an IBE clean-up etch is used to remove dielectric material and redeposited materials from the sidewalls of the MRAM pillar(s). During the IBE clean-up, dielectric gouging on the horizontal surfaces of both memory and logic areas of the device are reduced due to thicker film deposition during prior non-conformal dielectric deposition step(s). Such an approach allows for a more aggressive clean-up process to effectively remove metal residue from MRAM device sidewalls. Embodiments of the present invention recognize that underlying bottom electrode dielectric layers can be better preserved when the final cap dielectric in the logic and memory areas is thicker.

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Turning now to an overview of technologies that are more specifically relevant to aspects of the invention, with the growth of digital data applications, there is a need for increasingly fast and scalable memory technologies for data storage and data-driven computation. Electronic memory can be classified as volatile or non-volatile. Volatile memory retains its stored data only when power is supplied to the memory, but non-volatile memory retains its stored data without constant power. Volatile RAM provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

MRAM is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. A basic MTJ stack includes a free layer and a fixed/reference layer, each of which includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

In embedded MRAM devices, fabrication operations (e.g., ion beam etching) used to form the MTJ stack can result in significant gouging of the dielectric regions that are underneath the bottom electrode of the MTJ. This can result in the removal of most or all of the dielectric cap layer in both memory and logic areas in the MRAM device, thus exposing copper lines of the interconnect (or metallization) layer below.

The present invention will now be described in detail with reference to the Figures.

Figure 1:
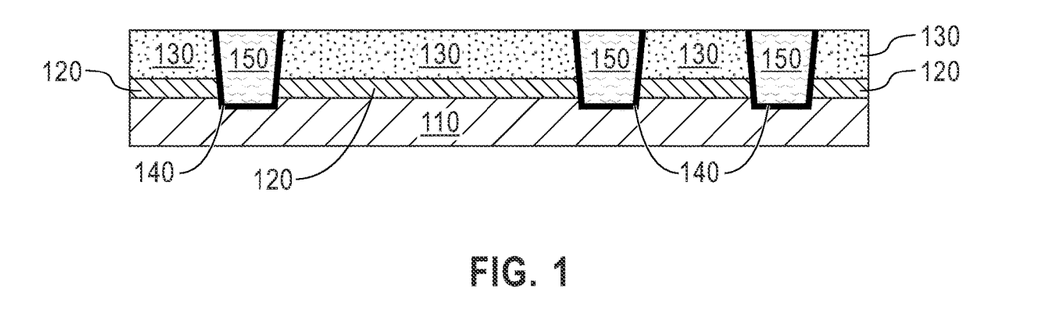
FIG. 1 depicts a semiconductor structure after an initial set of processing operations, in accordance with an embodiment of the invention.

FIG. 1 depicts a cross-sectional view of a device at an early stage in the method of forming the device and after an initial set of fabrication operations according to one embodiment of the invention. FIG. 1 shows the formation of metal lines 150 and barrier layer 140 within substrate 110, dielectric layer 120, and dielectric layer 130.

The depicted structure includes a logic area and a memory area that are referenced herein. The logic area comprises the left half of the depicted device and the memory area comprises the right half of the depicted device.

In some embodiments of the invention, the substrate 110 can include various middle of line (MOL) and front end of line (FEOL) structures. FEOL structures can include structures such as wells, source/drain (S/D) regions, extension junctions, silicide regions, liners, and the like. The MOL structures can include contacts and other structures that couple to the active regions (e.g., gate/source/drain) of the FEOL structures in the substrate 110. Networks of metal lines 150 (e.g., conductive lines, conductive wires, barrier layers, and the like) have been formed in substrate 110 as part of the BEOL structures formed during initial portions of the BEOL stage.

Substrate 110 is an interlayer dielectric. Substrate 110 serves as an isolation structure for the lines and vias of the structure. Substrate 110 can be made of any suitable dielectric material, such as, for example, low-κ dielectrics (i.e., materials having a small dielectric constant relative to silicon dioxide, i.e., less than about 3.9), ultra-low-κ dielectrics (i.e., materials having a dielectric constant less than 3), tetraethyl orthosilicate (TEOS), porous silicates, carbon doped oxides, silicon dioxides, silicon nitrides, silicon oxynitrides, silicon carbide (SiC), or other dielectric materials. Any known manner of forming substrate 110 can be utilized, such as, for example, chemical vapor deposition (CVD), plasma-enhanced chemical vapor deposition (PECVD), atomic layer deposition (ALD), flowable CVD, spin-on dielectrics, or physical vapor deposition (PVD).

Dielectric layer 120 is formed over the substrate 110. Dielectric layer 120 can be any suitable dielectric material such as, for example, SiN, SiCN(H), TEOS, SiO, or other oxide materials. Dielectric layer 120 can be deposited using CVD, PECVD, PVD, or other deposition processes.

Dielectric layer 130 is formed over dielectric layer 120. Dielectric layer 130 can be any suitable insulating material such as, for example, silicon dioxide, silicon nitride, nitrogen doped silicon carbide (SiC), and the like. In some embodiments, dielectric layer 130 is an ultra-low-κ dielectric (i.e., a material having a dielectric constant less than 3). Dielectric layer 130 can be deposited using CVD, PECVD, PVD, or other deposition processes.

The interconnect structure that comprises metal lines 150, in accordance with aspects of the invention, can be fabricated by patterning metal lines in a trench using lithography and etch.

In some embodiments of the invention, metal lines 150 include a conductive material formed or deposited in a trench of a metallization layer using known BEOL processes. In the depicted embodiment, the trenches are formed in dielectric layer 130, dielectric layer 120, and substrate 110. In some embodiments of the invention, metal lines 150 are overfilled above a surface of the trench (not shown), forming overfill that can be removed using, for example, a chemical-mechanical planarization (CMP) process. Metal lines 150 can be made of any suitable conducting material, such as, for example, metal (e.g., tungsten (W), titanium (Ti), tantalum (Ta), Ru, zirconium (Zr), Co, Cu, aluminum (Al), platinum (Pt)), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. In some embodiments of the invention, metal lines 150 are copper lines (copper interconnect). Metal lines 150 can be formed or deposited using, for example, CVD, PECVD, PVD, sputtering, plating, chemical solution deposition, and electroless plating. Metal lines 150 can further include a barrier layer 140 between the metal fill of the metal lines 150 and the surfaces of the trenches.

In some embodiments of the invention, barrier layer 140 can be formed between metal lines 150 and the surfaces of the trenches. Barrier layer 140 can serve as a diffusion barrier, preventing the copper (or other metal) from diffusing into, or doping, the surrounding dielectric materials, which can degrade the surrounding dielectric material properties. Silicon, for example, forms deep-level traps when doped with copper. Barrier layer 140 can be titanium (Ti), titanium nitride (TiN), tantalum (Ta), tantalum nitride (TaN), ruthenium (Ru), tungsten (W), tungsten nitride (WN), combinations thereof, or another high melting point metal or conductive metal nitride where the barrier layer 140 can prevent diffusion and/or alloying of the metal contact fill material (used to form the metal lines 150) with a top source/drain material, and/or anode/cathode material. In embodiments of the invention, the barrier layer 140 can be deposited by ALD, CVD, metalorganic chemical vapor deposition (MOCVD), PECVD, or combinations thereof. In embodiments of the invention, the metal fill of the metal lines 150 can be formed by ALD, CVD, and/or PVD.

Figure 2:
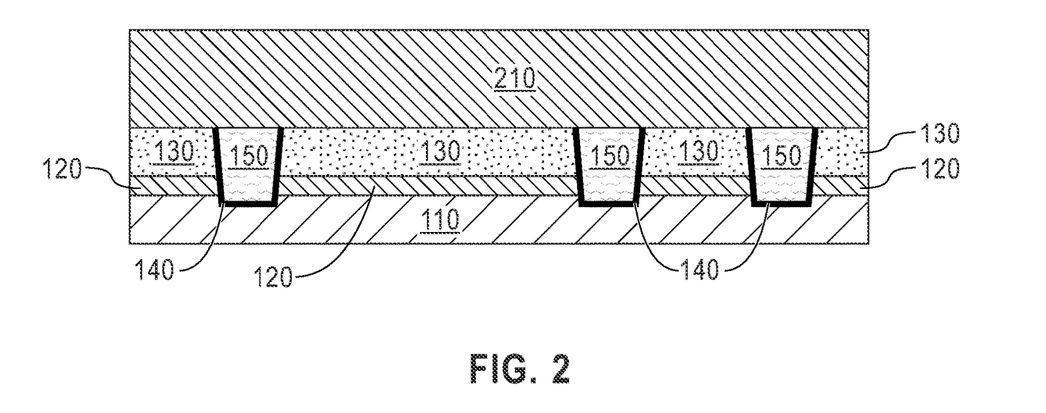
FIG. 2 depicts a process of forming a dielectric cap, in accordance with an embodiment of the invention.

FIG. 2 depicts a cross-sectional view of fabrication steps, in accordance with an embodiment of the present invention. FIG. 3 shows the formation of dielectric cap 210.

Dielectric cap 210 is formed over dielectric layer 130 and exposed portions of metal lines 150 and barrier layer 140. Dielectric cap 210 can be any suitable dielectric material such as, for example, SiN, SiCN(H), TEOS, SiOx, or other oxide materials. Dielectric cap 210 can be deposited using CVD, PECVD, PVD, or other deposition processes.

Figure 3:
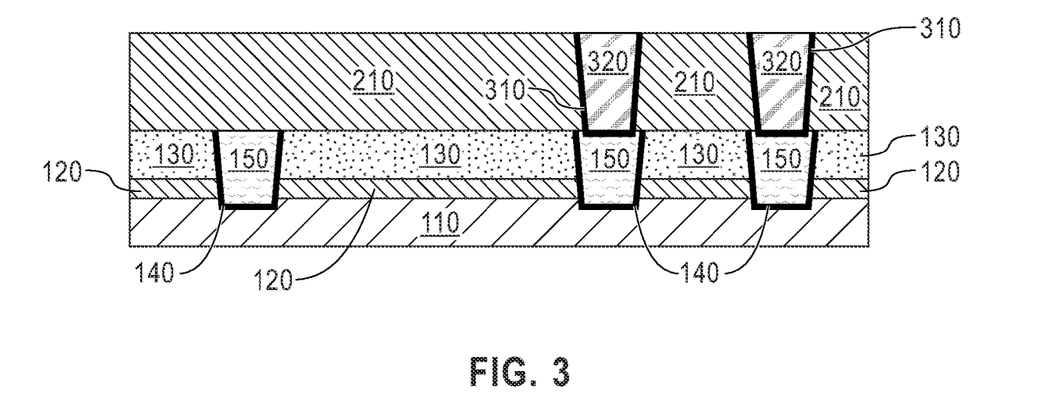
FIG. 3 depicts a process of forming metal contacts and barrier layers in the memory area of the device, in accordance with an embodiment of the invention.

FIG. 3 depicts a cross-sectional view of fabrication steps, in accordance with an embodiment of the present invention. FIG. 3 shows the formation of metal contacts 320 and barrier layers 310 in the memory area of the device.

Metal contacts 320 each act as bottom contacts for MRAM pillars.

One or more vias may be formed by an etching process, such as RIE, laser ablation, or any wet etch process which can be used to selectively remove a portion of material such as dielectric cap 210. A hardmask (not shown) may be patterned using photoresist to expose areas of dielectric cap 210 where trenches are desired and the hardmask may be utilized during the etching process in the creation of the trenches. The etching process only removes portions of dielectric cap 210 not protected by the hardmask and the etching process stops at metal lines 150.

In some embodiments, subsequent to the formation of the vias, the hardmask is removed. In general, the process of removing the hardmask involves the use of an etching process such as RIE, laser ablation, or any wet etch process which can be used to selectively remove a portion of material, such as the hardmask. In some embodiments, prior to the removal of the hardmask, the photoresist (not shown) is removed. The process of removing the photoresist is similar to that of the process of removing the hardmask.

In some embodiments of the invention, metal contact 320 includes a conductive material formed or deposited in a via using known BEOL processes. In some embodiments of the invention, metal contact 320 is overfilled above a surface of the trench (not shown), forming overfill that can be removed using, for example, a CMP process. Metal contact 320 can be made of any suitable conducting material, such as, for example, metal (e.g., W, Ti, Ta, Ru, Zr, Co, Cu, Al, Pt), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. Metal contact 320 can be formed or deposited using, for example, CVD, PECVD, PVD, sputtering, plating, chemical solution deposition, and electroless plating. Metal contact 320 can further include a barrier layer 310 between the metal fill of metal contact 320 and dielectric cap 210.

In some embodiments of the invention, barrier layer 310 can be formed between metal contact 320 and dielectric cap 210. Barrier layer 310 can serve as a diffusion barrier, preventing the copper (or other metal) from diffusing into, or doping, the surrounding dielectric materials, which can degrade the surrounding dielectric material properties. Silicon, for example, forms deep-level traps when doped with copper. Barrier layer 310 can be Ti, TiN, Ta, TaN, Ru, W, WN, combinations thereof, or another high melting point metal or conductive metal nitride where the barrier layer 310 can prevent diffusion and/or alloying of the metal contact fill material (used to form metal contact 320) with a top source/drain material, and/or anode/cathode material. In embodiments of the invention, barrier layer 310 can be deposited by ALD, CVD, MOCVD, PECVD, or combinations thereof. In embodiments of the invention, the metal fill of the metal contact 820 can be formed by ALD, CVD, and/or PVD.

Figure 4:
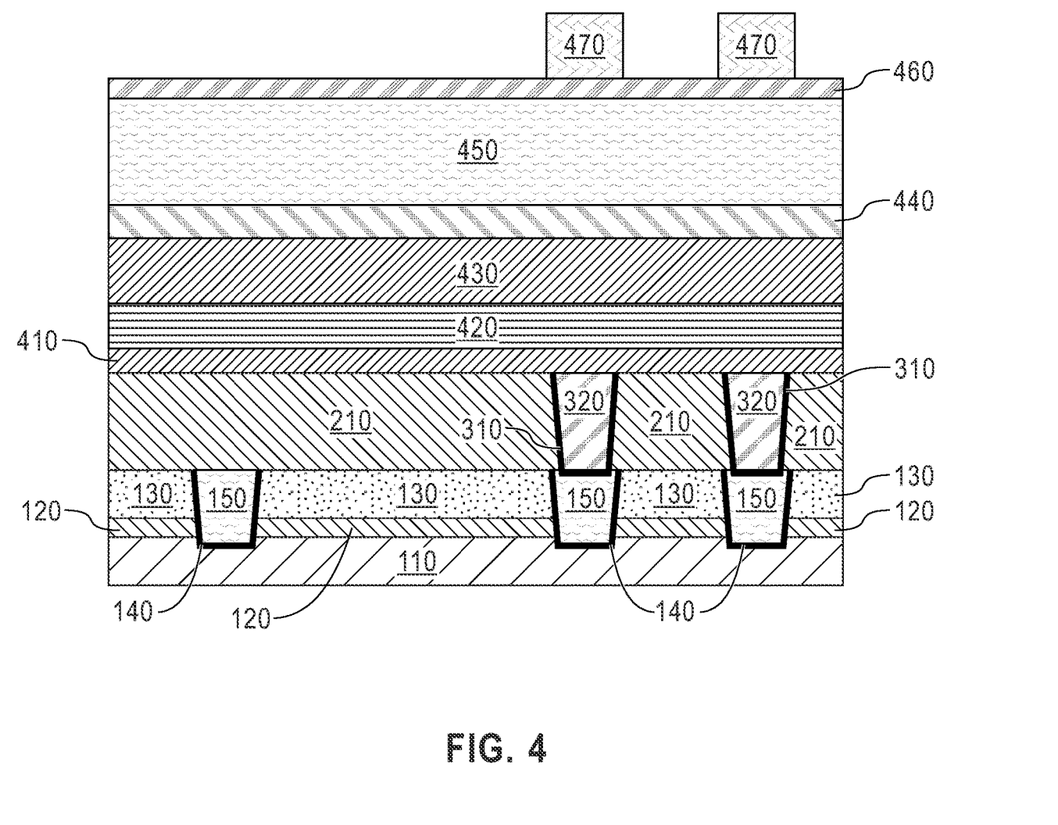
FIG. 4 depicts a process of forming a magnetoresistive random-access memory (MRAM) stack and hardmask and patterning a photoresist, in accordance with an embodiment of the invention.

FIG. 4 depicts a cross-sectional view of fabrication steps, in accordance with an embodiment of the present invention. FIG. 4 shows the formation of the MRAM stack and hardmask and patterning of photoresist 470.

Bottom electrode layer 410 is formed over exposed surfaces of dielectric cap 210, barrier layer 310, and metal contacts 320. Bottom electrode layer 410 is deposited using any suitable means such as, for example, CVD or ALD. Bottom electrode layer 410 may be Ti, TiN, Ta, TaN, Ru, HfN, Nb, NbN, W, WN, WCN, Mo, Cr, V, Pd, Pt, Rh, Sc, Al, combinations thereof, or another high melting point metal or conductive metal nitride.

Known fabrication techniques are utilized to form an MRAM stack according to one or more embodiments. The MRAM stack can be formed by depositing MTJ stack 420, a top electrode layer 430, hardmask 440, along with a tri-level mask (organic planarization layer (OPL) 450, anti-reflection coating (ARC) layer 460, and photoresist 470) where the photoresist 470 covers the MRAM stack at a desired location for an MRAM pillar.

MTJ stack 420 includes a free layer and a fixed/reference layer, each of which includes a magnetic material. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers) can be included in MTJ stack 420. MTJ stack 420 is deposited over bottom electrode layer 410 using known fabrication operations.

Top electrode layer 430 is formed over MTJ stack 420. Top electrode layer 430 is deposited using any suitable means such as, for example, CVD or ALD. Top electrode layer 430 may be Ti, TiN, Ta, TaN, Ru, HfN, Nb, NbN, W, WN, WCN, Mo, Cr, V, Pd, Pt, Rh, Sc, Al, combinations thereof, or another high melting point metal or conductive metal nitride.

Hardmask 440 is formed over top electrode layer 430. Hardmask 440 is deposited using any suitable means such as, for example, CVD or ALD. Hardmask 440 can be made of any suitable dielectric material, such as, for example, TEOS, silicon dioxides, silicon nitrides, silicon oxynitrides, SiC, or other non-porous dielectric materials.

OPL 450 is formed on hardmask 440. OPL 450 can be spun on and baked, or can be deposited by CVD. OPL 450 may be, for example, a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, OPL 450 can include a transparent organic polymer.

ARC layer 460 is formed on OPL 450. ARC layer 460 is deposited using any suitable means such as, for example, spin coat, CVD, or ALD. ARC layer 460 can include SiARC, although other ARC layer materials can be employed.

Photoresist 470 is deposited on top of ARC layer 460. Photoresist 470 may be a light-sensitive polymer that acts as a lithography mask. In various embodiments, standard photolithographic processes are used to define a pattern of ARC layer 460 in a layer of photoresist 470 deposited on ARC layer 460. The desired pattern may then be formed in by removing ARC layer 460, OPL 450, and hardmask 440 from the areas not protected by the pattern in the photoresist 470 layer. ARC layer 460, OPL 450, and hardmask 440 are removed using, for example, RIE. RIE uses chemically reactive plasma, generated by an electromagnetic field, to remove various materials. A person of ordinary skill in the art will recognize that the type of plasma used will depend on the material of which ARC layer 460, OPL 450, and hardmask 440 are composed, or that other etch processes such as wet chemical etching or laser ablation may be used.

Figure 5:
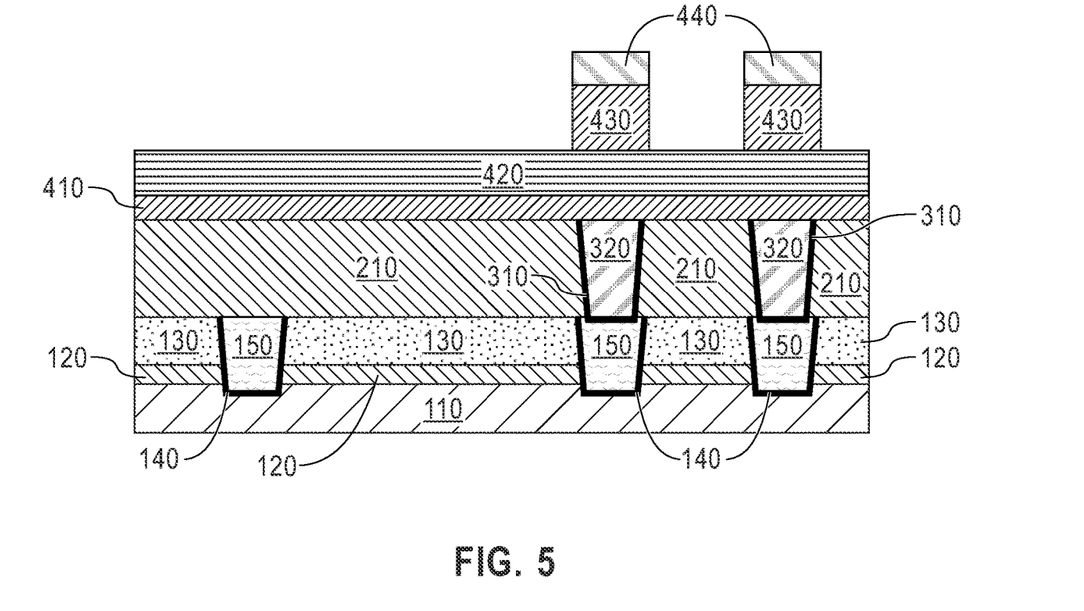
FIG. 5 depicts a process of removing portions of a hardmask and a top electrode layer that are not protected by a photoresist and the subsequent removal of the photoresist and remaining portions of organic planarization layer (OPL) and antireflection coating (ARC) layer, in accordance with an embodiment of the invention.

FIG. 5 depicts a cross-sectional view of fabrication steps, in accordance with an embodiment of the present invention. FIG. 5 shows the removal of portions of hardmask 440 and top electrode layer 430 not protected by photoresist 470 and subsequent removal of photoresist 470 and remaining portions of OPL 450 and ARC layer 460.

Photoresist 970 is patterned using lithography to form pillars which are then transferred to top electrode layer 930 using RIE. The process of removing photoresist 970 and remaining portions of OPL 950 and ARC layer 960 generally involves the use of an etching process such as RIE, laser ablation, or any etch process which can be used to selectively remove a portion of material such as photoresist 970, OPL 950, and/or ARC layer 960. In some embodiments, the process for removing OPL 950 may be an ashing process.

For example, the remaining portions of OPL 950 may be removed by a $O_2$ or $N_2/H_2$ plasma.

Figure 6:
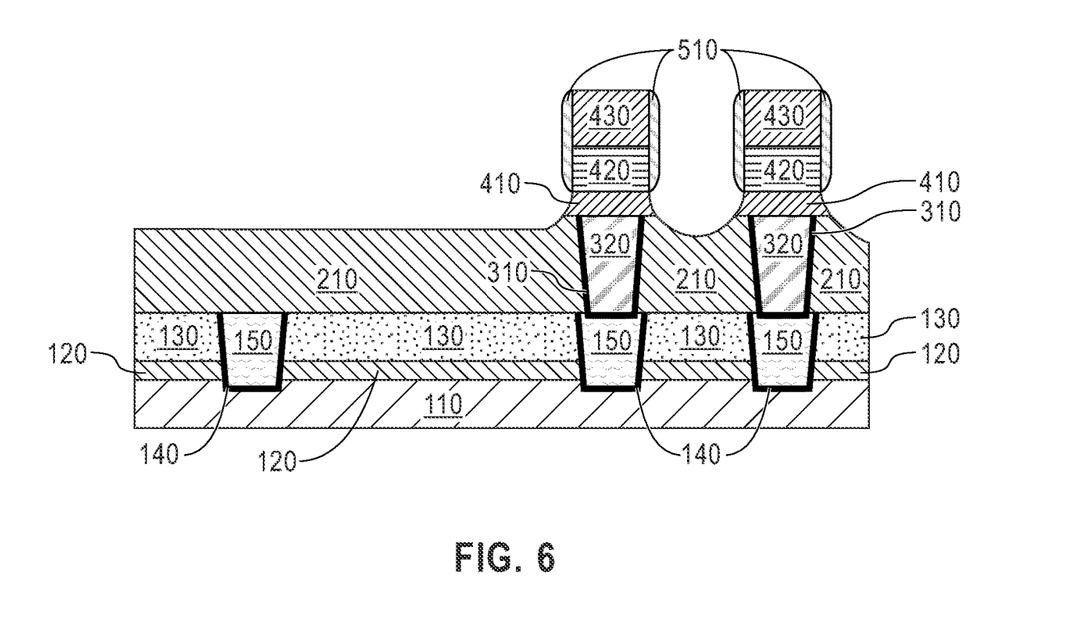
FIG. 6 depicts a process of forming MRAM pillars, in accordance with an embodiment of the invention.

FIG. 6 depicts a cross-sectional view of fabrication steps, in accordance with an embodiment of the present invention. FIG. 6 shows the formation of MRAM pillars.

In some embodiments, the pillar pattern is transferred from top electrode layer 430 to MTJ stack 420 and bottom electrode layer 410 using an etching operations such as, for example, IBE. A portion of the dielectric cap 210 remains after the IBE protecting metal contact 320 in the memory area and interconnect structures in the logic area from IBE gouging. In one or more embodiments, the critical dimension of metal contact 320 is smaller (i.e. has a narrower width) than that of bottom electrode layer 310 and/or MTJ stack 420 to prevent exposure of metal contact 320 during MTJ pillar patterning using IBE. This reduces the possibility of any additional metal sputtering and redeposition on MTJ pillars after etching and reduces risk of tunnel junction shorts.

In some embodiments, as a result of the IBE process, redeposited material 510 may be present on sidewalls of the MRAM pillars. Such redeposited material may be, for example, metal. Redeposited material 510 will be subsequently removed during an IBE clean-up etch, as described with reference to FIG. 8.

Figure 7:
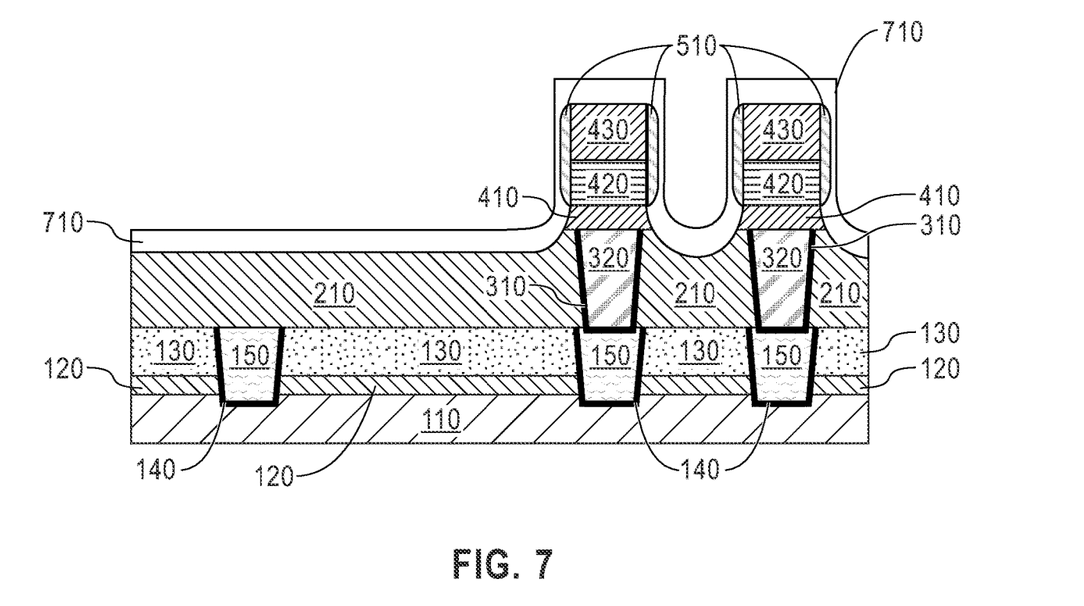
FIG. 7 depicts a process of forming a dielectric layer, in accordance with an embodiment of the invention.

FIG. 7 depicts a cross-sectional view of fabrication steps, in accordance with an embodiment of the present invention. FIG. 7 shows the formation of dielectric layer 710.

Dielectric layer 710 can be deposited using a non-conformal deposition process such as PVD. Such a deposition process results in deposited material of dielectric layer 710 being thicker on horizontal surfaces as compared to the vertical sidewalls of the pillars. Dielectric layer 710 can be any suitable dielectric material including, but not limited to, SiN, SiCN(H), or SiC. In some embodiments, dielectric layer 710 is about ten times thicker on horizontal surfaces as compared to the thickness on the vertical sidewalls of the pillars.

Figure 8:
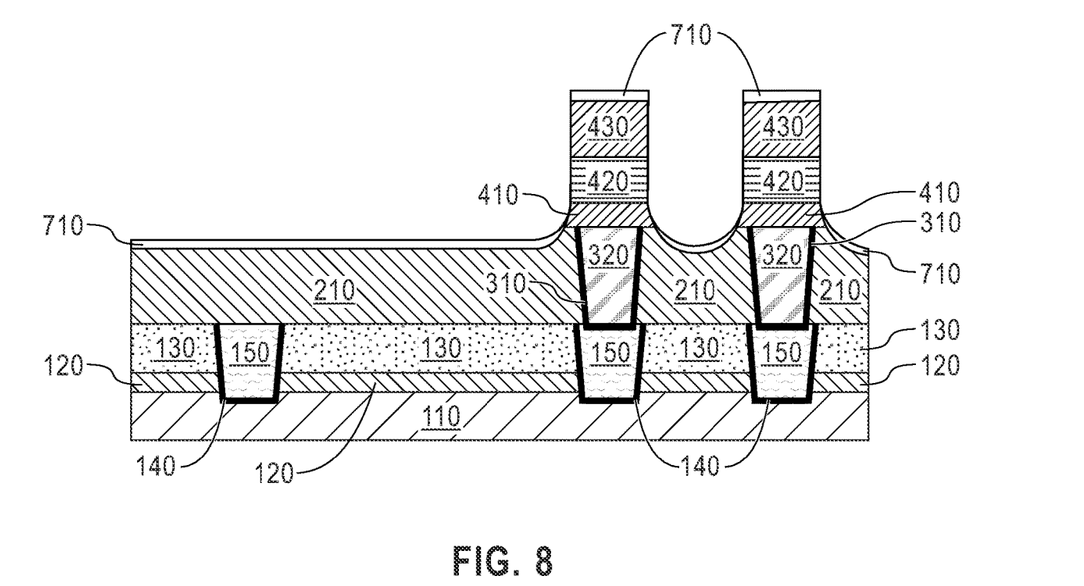
FIG. 8 depicts a process of removing redeposited material and portions of a dielectric layer, in accordance with an embodiment of the invention.

FIG. 8 depicts a cross-sectional view of fabrication steps, in accordance with an embodiment of the present invention. FIG. 8 shows the removal of redeposited material 510 and portions of dielectric layer 710.

In some embodiments, the pillar pattern is again transferred from top electrode layer 430 to MTJ stack 420 and bottom electrode layer 410 using an etching operations such as, for example, IBE. A portion of the dielectric layer 710 remains on horizontal portions of the device after the IBE due to the horizontal surfaces originally having a thicker layer of dielectric layer 710. The removal of redeposited material 510 and dielectric layer 710 is a part of a clean-up etch process. Dielectric gouging on the horizontal surfaces is reduced due to the thicker film deposited during the preceding non-conformal deposition of dielectric layer 710. Accordingly, a more aggressive clean-up process can be used to effectively remove all metal residue from the MRAM pillar sidewalls, such as redeposited material 510.

Figure 9:
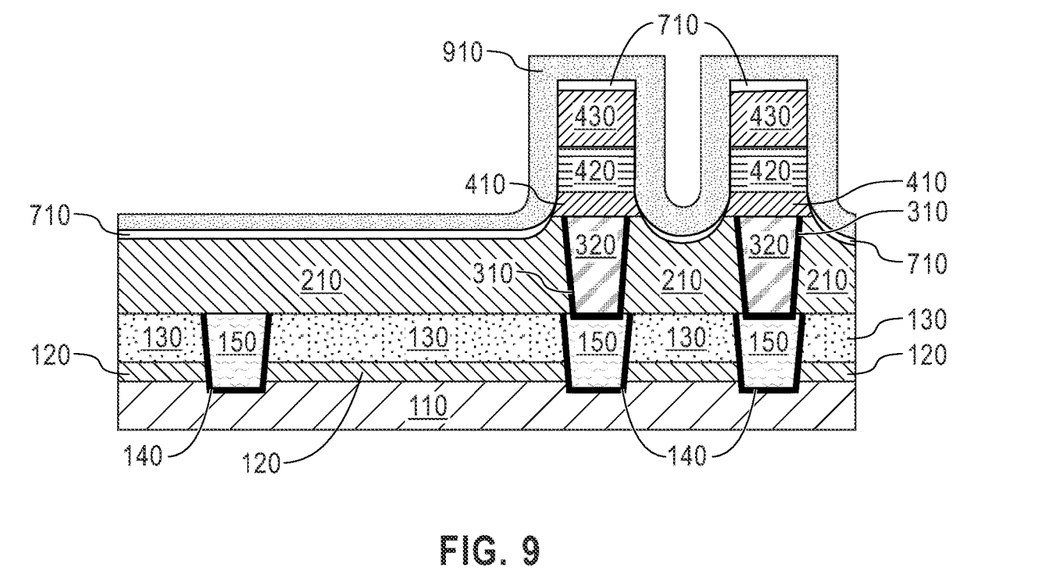
FIG. 9 depicts a process of forming a pillar encapsulation layer, in accordance with an embodiment of the invention.

FIG. 9 depicts a cross-sectional view of fabrication steps, in accordance with an embodiment of the present invention. FIG. 9 shows the formation of pillar encapsulation layer 910.

Pillar encapsulation layer 910 can be conformally deposited over exposed portions of the device using any known deposition process such as, for example, CVD or ALD. Pillar encapsulation layer 910 can be any suitable dielectric material including, but not limited to, SiN, SiCN(H), or SiC.

Figure 10:
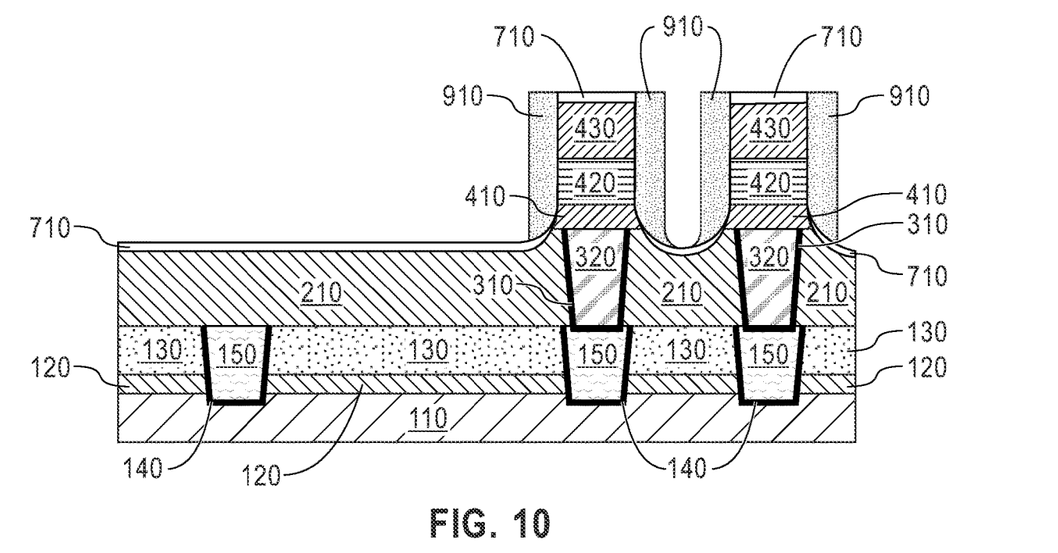
FIG. 10 depicts a process of performing an encapsulation etch back, in accordance with an embodiment of the invention.

FIG. 10 depicts a cross-sectional view of fabrication steps, in accordance with an embodiment of the present invention. FIG. 10 shows an encapsulation etch back of portions of pillar encapsulation layer 910.

An anisotropic etch process can be used to perform the encapsulation etch back. As depicted, this can result in portions of pillar encapsulation layer 910 being removed from lateral surfaces stopping on dielectric layer 710, but remaining on the sidewalls of the MRAM pillars. This is due to the slower etch rate at the sidewall caused by the anisotropic etch process. The etch back depth may vary based on the desired final structure of the device. In some embodiments, subsequent to the etch back, the combined thickness of dielectric layer 710 and dielectric cap 210 is greater than fifty nanometers.

Figure 11:
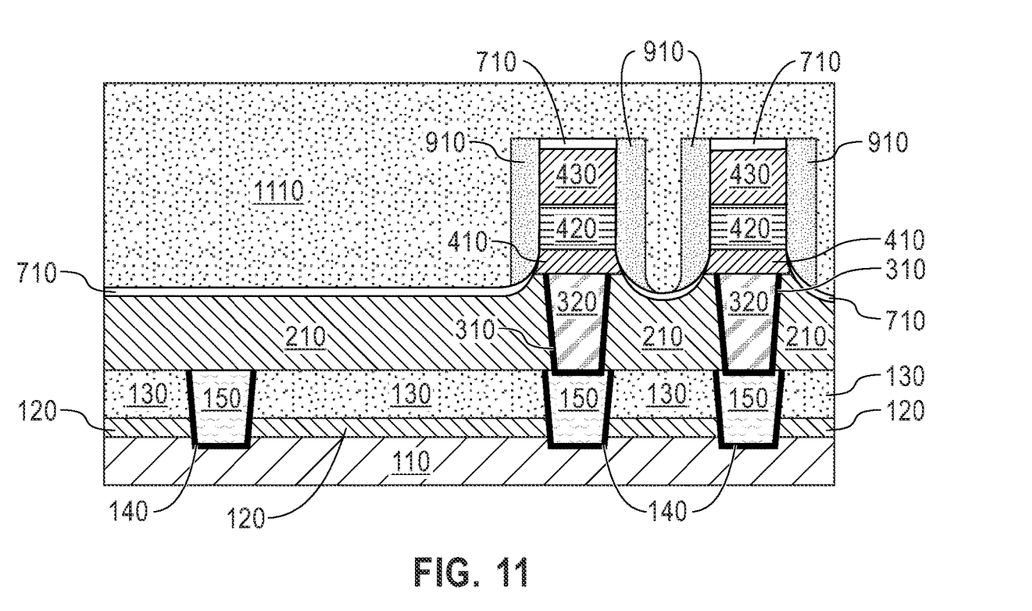
FIG. 11 depicts a process of forming an interlayer dielectric (ILD) layer, in accordance with an embodiment of the invention.

FIG. 11 depicts a cross-sectional view of fabrication steps, in accordance with an embodiment of the present invention. FIG. 11 shows the formation of interlayer dielectric (ILD) layer 1110.

ILD layer 1110 can be deposited over the exposed portions of the device. ILD layer 1110 may be any type of interlayer dielectric material including, for example, ultra-low-κ dielectrics (i.e., materials having a dielectric constant less than 3).

Figure 12:
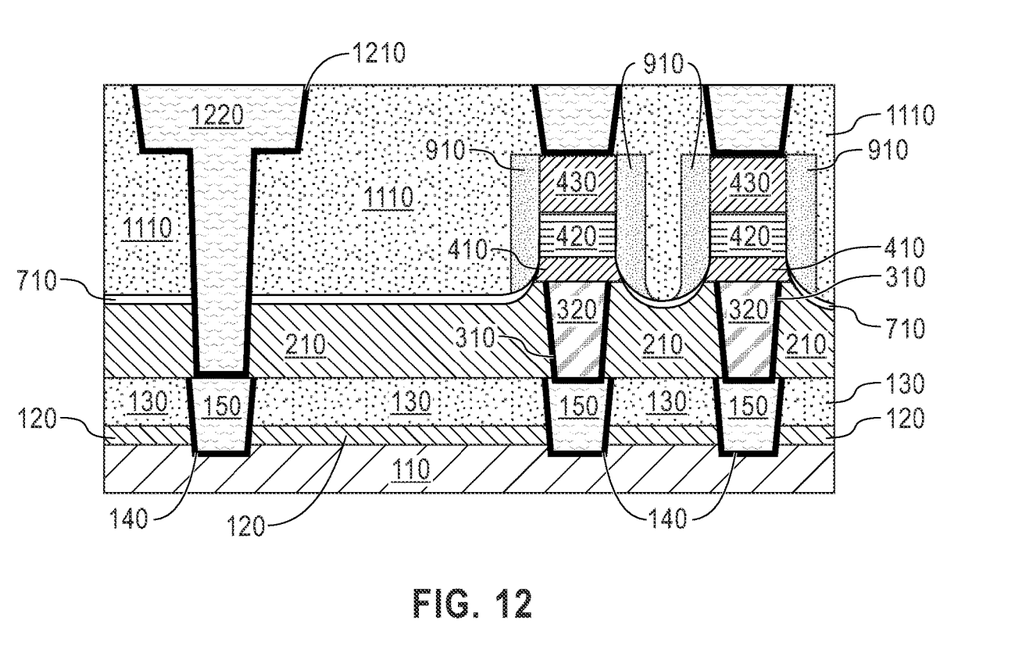
FIG. 12 depicts a process of forming contacts and a barrier layer, in accordance with an embodiment of the invention.

FIG. 12 depicts a cross-sectional view of fabrication steps, in accordance with an embodiment of the present invention. FIG. 12 shows the formation of contacts 1220 and barrier layer 1210.

Known fabrication techniques are utilized to form contacts 1220 in the memory region and logic region, according to one or more embodiments of the invention. Trenches can be formed in ILD layer 1110, dielectric layer 710, and dielectric cap 210 to expose portions of top electrode layers 430 in the memory area and portions of the interconnect structures in the logic area (e.g., metal lines 150).

A barrier layer 1210 can be formed in the trenches followed by deposition of contacts 1220. Barrier layer 1210 can be Ti, TiN, Ta, TaN, Ru, W, WN, WCN, combinations thereof, or another high melting point metal or conductive metal nitride. In embodiments of the invention, the barrier layer 1210 can be deposited by ALD, CVD, MOCVD, PECVD, or combinations thereof.

Contacts 1220 can be made of any suitable conducting material, such as, for example, metal (e.g., W, Ti, Ta, Ru, Zr, Co, Cu, Al, Pt), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. A resist, such as a photoresist along with tri-layer lithographic stack, can be deposited and patterned to form the trenches for the metal lines and contacts 1220. In some embodiments of the invention, contacts 1220 are overfilled above a surface of the trench (not shown), forming overfill that can be removed using, for example, a CMP process.

Figure 13:
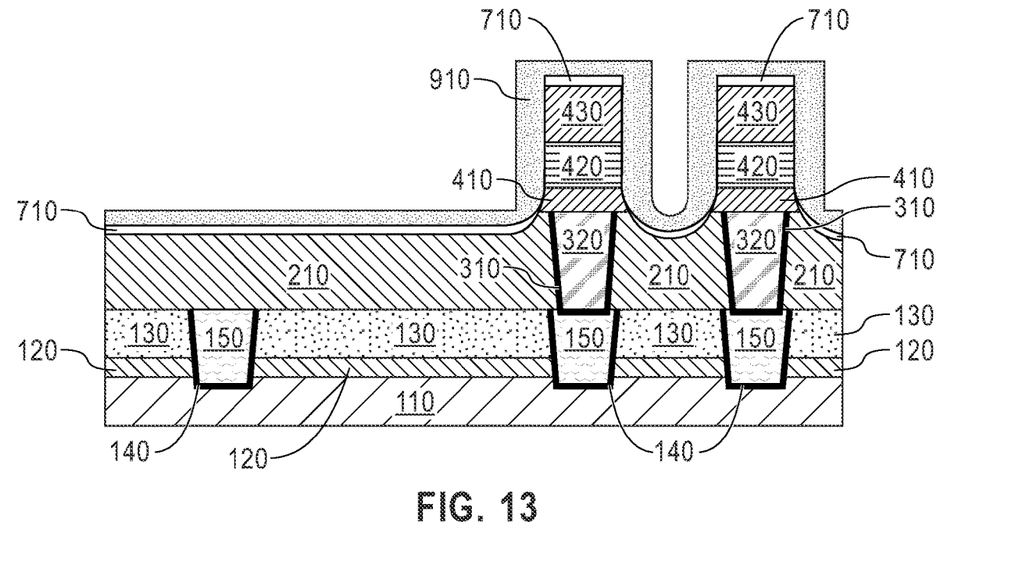
FIG. 13 depicts a process of performing a partial encapsulation etch back, in accordance with an embodiment of the invention.
Figure 14:
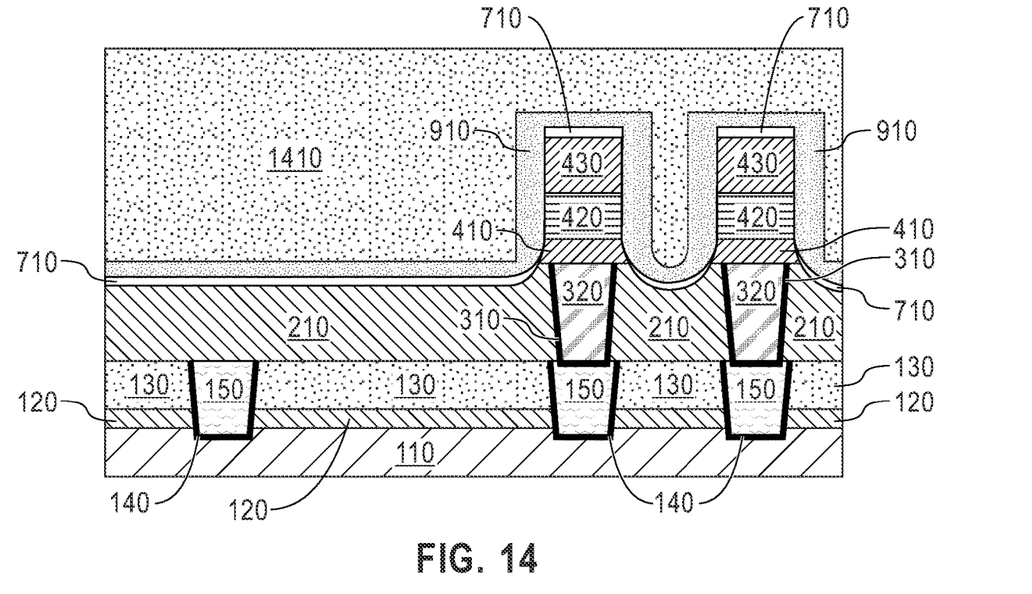
FIG. 14 depicts a process of forming an ILD layer, in accordance with an embodiment of the invention.
Figure 15:
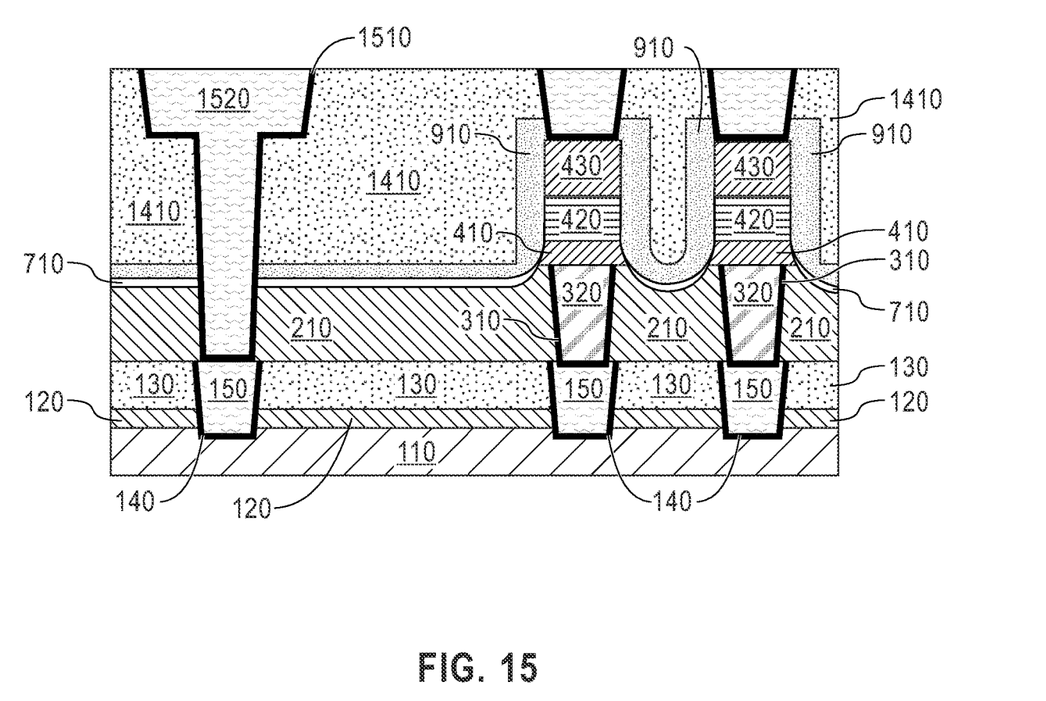
FIG. 15 depicts a process of forming contacts and a barrier layer, in accordance with an embodiment of the invention.

FIGS. 13-15 depict embodiments of the present invention that are formed according to a different fabrication process.

The fabrication process depicted by FIG. 13 is performed on the same device originally depicted in FIG. 9. Accordingly, the initial fabrication steps are similar to those already described with respect to FIGS. 1-9.

FIG. 13 depicts a cross-sectional view of fabrication steps, in accordance with an embodiment of the present invention. FIG. 10 shows a partial encapsulation etch back of portions of pillar encapsulation layer 910.

An anisotropic etch process can be used to perform the encapsulation etch back. As depicted, this can result in portions of pillar encapsulation layer 910 being removed from lateral surfaces, with portions of pillar encapsulation layer 910 still remaining on both dielectric layer 710 and the sidewalls of the MRAM pillars. This is due to the slower etch rate at the sidewall caused by the anisotropic etch process. The etch back depth may vary based on the desired final structure of the device. In some embodiments, subsequent to the etch back, the combined thickness of dielectric layer 710 and dielectric cap 210 is greater than fifty nanometers.

FIG. 14 depicts a cross-sectional view of fabrication steps, in accordance with an embodiment of the present invention. FIG. 11 shows the formation of interlayer dielectric (ILD) layer 1410.

ILD layer 1410 can be deposited over the exposed portions of the device. ILD layer 1410 may be any type of interlayer dielectric material including, for example, ultra-low-κ dielectrics (i.e., materials having a dielectric constant less than 3).

FIG. 15 depicts a cross-sectional view of fabrication steps, in accordance with an embodiment of the present invention. FIG. 15 shows the formation of contacts 1520 and barrier layer 1510.

Known fabrication techniques are utilized to form contacts 1520 in the memory region and logic region, according to one or more embodiments of the invention. Trenches can be formed in ILD layer 1410, pillar encapsulation layer 910, dielectric layer 710, and dielectric cap 210 to expose portions of top electrode layers 430 in the memory area and portions of the interconnect structures in the logic area (e.g., metal lines 150).

A barrier layer 1510 can be formed in the trenches followed by deposition of contacts 1520. Barrier layer 1510 can be Ti, TiN, Ta, TaN, Ru, W, WN, WCN, combinations thereof, or another high melting point metal or conductive metal nitride. In embodiments of the invention, the barrier layer 1510 can be deposited by ALD, CVD, MOCVD, PECVD, or combinations thereof.

Contacts 1520 can be made of any suitable conducting material, such as, for example, metal (e.g., W, Ti, Ta, Ru, Zr, Co, Cu, Al, Pt), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. A resist, such as a photoresist along with tri-layer lithographic stack, can be deposited and patterned to form the trenches for the metal lines and contacts 1520. In some embodiments of the invention, contacts 1520 are overfilled above a surface of the trench (not shown), forming overfill that can be removed using, for example, a CMP process.

The resulting structure includes an MRAM device with minimum bottom electrode dielectric gouging. The underlying bottom electrode dielectric is preserved and a thicker multilayer final dielectric cap layer remains in both the logic and memory areas of the device. Such an approach allows longer IBE over etch and clean-up etch preventing footing at the base of MRAM pillars and eliminating metal residue from residing on MTJ sidewalls of the resulting structure. By preventing metal residue from residing on the MTJ sidewalls, junction shorts can be prevented.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
   providing a substrate having an embedded memory area interconnect structure and an embedded non-memory area interconnect structure, the memory area interconnect structure comprising metal interconnects formed in dielectric material;
   forming a dielectric cap layer on exposed surfaces of the memory area and the non-memory area;
   forming a bottom metal contact on a first metal interconnect of the memory area interconnect structure, the bottom metal contact in a trench in the dielectric cap layer;
   forming a memory element stack pillar on the bottom metal contact;
   forming a dielectric layer on exposed surfaces of the memory area and the non-memory area utilizing a non-conformal deposition process; and
   removing the dielectric layer from sidewalls of the memory element stack pillar, exposing sidewalls of a magnetic tunnel junction (MTJ) stack of the memory element pillar.

2. The method of claim 1, wherein forming the memory element stack pillar on the bottom metal contact comprises:
   forming memory element stack layers on exposed surfaces of the memory area and the non-memory area; and
   selectively removing portions of the memory element stack layers to form the memory element stack pillar on the bottom metal contact.

3. The method of claim 1, wherein:
   subsequent to forming the memory element stack pillar, redeposited material is present on the sidewalls of the memory element stack pillar; and
   removing the dielectric layer from the sidewalls of the memory element stack pillar further comprises removing the redeposited material from the sidewalls of the memory element stack pillar.

4. The method of claim 1, wherein the non-conformal deposition process comprises a physical vapor deposition process.

5. The method of claim 2, wherein selectively removing portions of the memory element stack layers comprises an ion beam etching process.

6. The method of claim 1, wherein forming the bottom metal contact in the trench comprises:
   forming the trench, the trench formed over the first metal interconnect of the memory area interconnect structure; and
   forming the bottom metal contact in the trench.

7. The method of claim 1, further comprising:
   forming a first top contact over the memory element stack pillar; and
   forming a second top contact over the metal interconnect of the non-memory area interconnect structure.

8. The method of claim 1, further comprising:
   subsequent to removing the dielectric layer from the sidewalls of the memory element stack pillar, forming a pillar encapsulation layer on exposed surfaces of the memory area and the non-memory area.

9. The method of claim 8, further comprising:
   performing an anisotropic etch process to expose the dielectric layer; and
   forming an interlayer dielectric layer on exposed surfaces of the memory area and the non-memory area.

10. The method of claim 8, further comprising:
    performing an anisotropic etch process that removes a portion of the pillar encapsulation layer; and
    forming an interlayer dielectric layer on exposed surfaces of the memory area and the non-memory area.

11. A semiconductor structure comprising:
    an embedded memory area interconnect structure and an embedded non-memory area interconnect structure, the memory area interconnect structure comprising metal interconnects formed in dielectric material;
    a dielectric cap layer in the memory area and the non-memory area;
    a bottom metal contact on a metal interconnect of the memory area interconnect structure, the bottom metal contact in a trench formed in the dielectric cap layer;
    a dielectric layer on the dielectric cap layer, wherein the dielectric cap layer and the dielectric layer have a combined thickness of greater than fifty nanometers; and
    a memory element stack pillar on the bottom metal contact.

12. The semiconductor structure of claim 11, wherein the memory element stack pillar comprises a magnetic tunnel junction (MTJ) stack.

13. The semiconductor structure of claim 11, further comprising:
    a barrier layer present on the metal interconnects formed in the dielectric material and the bottom metal contact.

14. The semiconductor structure of claim 11, further comprising:
    a top contact on a metal interconnect structure of the non-memory area interconnect structure.

15. The semiconductor structure of claim 11, further comprising:
    a top contact over the memory element stack pillar.

16. The semiconductor structure of claim 11, further comprising:
    a pillar encapsulation layer on sidewalls of the memory element stack pillar, the pillar encapsulation layer comprising dielectric material.

17. The semiconductor structure of claim 15, further comprising:
    an interlayer dielectric layer on exposed surfaces of a pillar encapsulation layer, the dielectric cap, and sidewalls of the top contact.

18. The semiconductor structure of claim 11, further comprising:
    a pillar encapsulation layer on the dielectric layer and sidewalls of the memory element stack pillar, the pillar encapsulation layer comprising dielectric material.

19. The semiconductor structure of claim 12, further comprising:
    a top electrode on the MTJ stack; and
    a bottom electrode between the MTJ stack and the bottom metal contact.

20. The method of claim 1, wherein subsequent to removing the dielectric layer from the sidewalls of the memory element stack pillar, a portion of the dielectric layer remains that completely covers top surfaces of the dielectric cap layer.

* * * * *